United States Patent [19]

Moyal

[11] Patent Number: 4,887,085
[45] Date of Patent: Dec. 12, 1989

[54] TIME CONTINUOUS, DIFFERENTIAL ANALOG-TO-DIGITAL CONVERTER

[75] Inventor: Miki Z. Moyal, Austin, Tex.

[73] Assignee: Advanced Micro Devices, Inc., Sunnyvale, Calif.

[21] Appl. No.: 286,198

[22] Filed: Dec. 19, 1988

[51] Int. Cl.$^4$ ............................................. H03M 1/56
[52] U.S. Cl. ................................... 341/169; 341/166
[58] Field of Search ............... 341/128, 129, 155, 166, 341/167, 168, 169, 170; 328/127; 320/1

[56] References Cited

U.S. PATENT DOCUMENTS

| | | | |
|---|---|---|---|
| 4,195,235 | 3/1980 | Schoeff | 341/167 |
| 4,254,406 | 3/1981 | Meares | 341/157 |
| 4,381,498 | 4/1983 | Goodale | 341/169 |

Primary Examiner—William M. Shoop, Jr.
Assistant Examiner—Brian Young
Attorney, Agent, or Firm—Salzman & Levy

[57] ABSTRACT

The invention is for an analog-to-digital converter which is useful for audio applications owing to its insensitivity to noise. The converter achieves this insensitivity by utilizing a differential, common node integrator having a non-switching capacitive feed-back loop.

9 Claims, 2 Drawing Sheets

TIME CONTINUOUS, DIFFERENTIAL ANALOG-TO-DIGITAL CONVERTER.

FIELD OF THE INVENTION

The invention relates to analog-to-digital converters, and more particularly to a monolithic, time continuous over-sampled analog-to-digital converter having a differential, time continuous integrator that is forgiving of capacitive tolerances.

BACKGROUND OF THE INVENTION

There are many different types of analog-to-digital converters. Analog-to-digital converters which have a single ended structure are generally sensitive to crosstalk from other circuits on a chip. They are also sensitive to power supply noise, and di/dt effects and other forms of common mode generated noise. In addition, this type of converter will produce a high degree of unwanted asymmetrical voltage output due to miss-balances in the positive versus negative scales.

To counter these disadvantages, switching capacitors with differential integration have been applied. However, this approach is not entirely successful, since this type of structure is sensitive to clocks feed-through, and requires precisely matched capacitance. In the fabrication of these devices on a chip using a CMOS process, such structures require an additional masking step.

The linear, time continuous, over-sampling analog-to-digital converter of the present invention is constructed utilizing a 1.2u CMOS process, which is described in AMD DSLAC DESIGN REVIEW I & II (1987). The analog-to-digital converter of this invention operates in the differential mode and provides the capability of delivering up to the high dynamic range without the use of any switch capacitance techniques or the use of precisely matched capacitances.

The converter of the invention can be used in audio applications, such as for CODECs and MODEMs, particularly where such devices operate together in a noisy environment.

SUMMARY OF THE INVENTION

The invention features a continuous, differential analog-to-digital converter comprising a split input stage whose voltage signals are changed to current signals by a pair of operational amplifiers and a pair of resistors respectively connected to the operational amplifiers.

A differential current generator provided by a 6.02 dB per bit DAC forms a loop circuit with a continuous, differential, non-switch capacitive integrator, whose analog current signals are digitized and compared by a comparator disposed within the loop circuit.

A clocked binary counter connected to the comparator increments or decrements one step in response to each comparison of a generated current signal with the analog current signal. The binary counter is clocked at 2.048 MHz.

The loop circuit comprises a pair of split capacitor and resistor elements.

The analog-to-digital converter forms a CMOS integrated circuit.

It is an object of this invention to provide an improved analog-to-digital converter.

It is another object of the invention to provide an analog-to-digital converter that is useful in audio applications and is characterized by its noise insensitivity.

These and other objects of this invention will be better understood and will become more apparent with reference to the following detailed description considered in conjunction with the accompanying drawings.

DETAILED DESCRIPTION OF THE INVENTION

Generally speaking, the invention pertains to an analog-to-digital converter that samples the analog signals in a differential mode and is relatively insensitive to noise by virtue of a non-switch capacitive integrator of unique design. The non-switch capacitive design of the integrator is ideally suited for CMOS fabrication, since this construction does not require an additional masking step.

Figure 1:
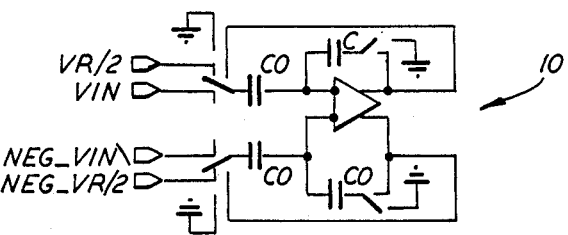
FIG. 1 is a circuit diagram of a prior art integrator utilizing switch capacitance.

Now referring to FIG. 1, a prior art switch capacitive integrator circuit 10 is shown. Such an integrator circuit 10 is useful in suppressing noise, since noise signals will be equally amplified and integrated by the differential structure of the circuit. Such noise suppression is most useful in audio systems. However, such a circuit 10 is sensitive to clocks feed-through, and in most cases requires highly accurate and precise capacitors.

It is one of the objects of the current invention to provide a low-cost integrated circuit, and the need for precision capacitors is contrary to this objective. Furthermore, such a design can only be achieved by utilizing an additional masking step in a CMOS process, such as that described in IEEE International Solid-State Circuits Conference ISSCC (1988) page 258, "Design of a CMOS Second Order Sigma-Delta Modulator," by Bernhard E. Bosen & Bruce A. Wooley. Such an additional processing step obviously increases costs, and is not compatible with the stated objective.

Figure 2:
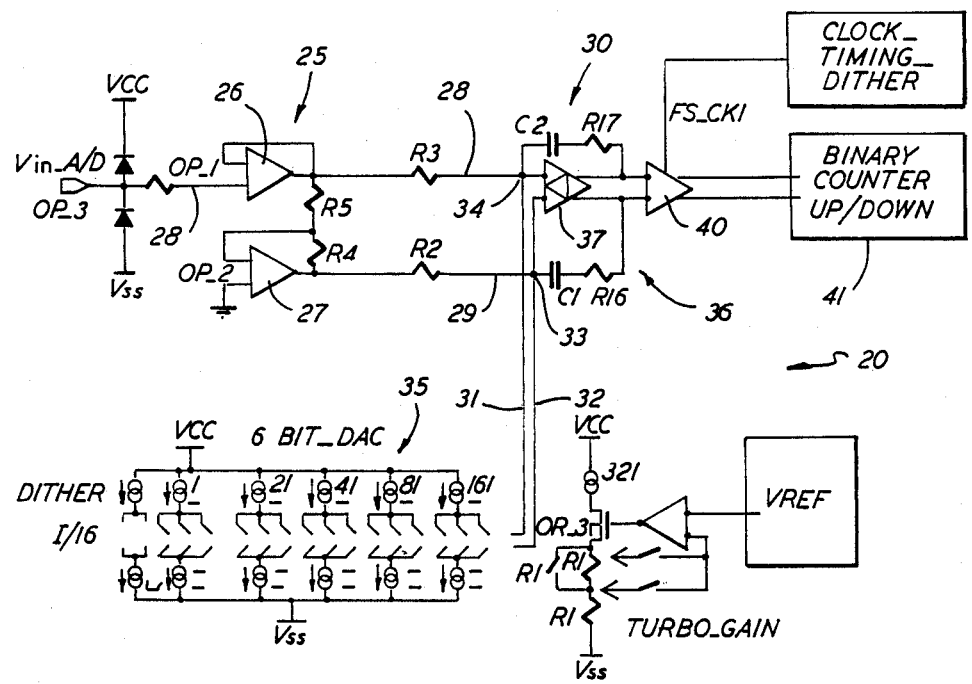
FIG. 2 is a circuit diagram of the analog-to-digital converter of this invention utilizing a differential, non-switch capacitive integrator.

Referring to FIG. 2 a circuit 20 is shown of the time continuous, over-sampled, differential analog-to-digital converter of this invention. The analog signals are supplied to the circuit 20 by means of a split input stage 25 comprising two operational amplifiers 26 and 27, respectively, which receive the analog voltage input via line 28 and convert this input to differential analog current signals by means of resistors R2 and R3, respectively. These current signals are fed to the integrator (input) stage 30, via lines 28 and 29.

A 6.02 dB per bit DAC 35 supplies differential reference currents to the integrator state 30 via lines 31 and 32.

Figure 3:
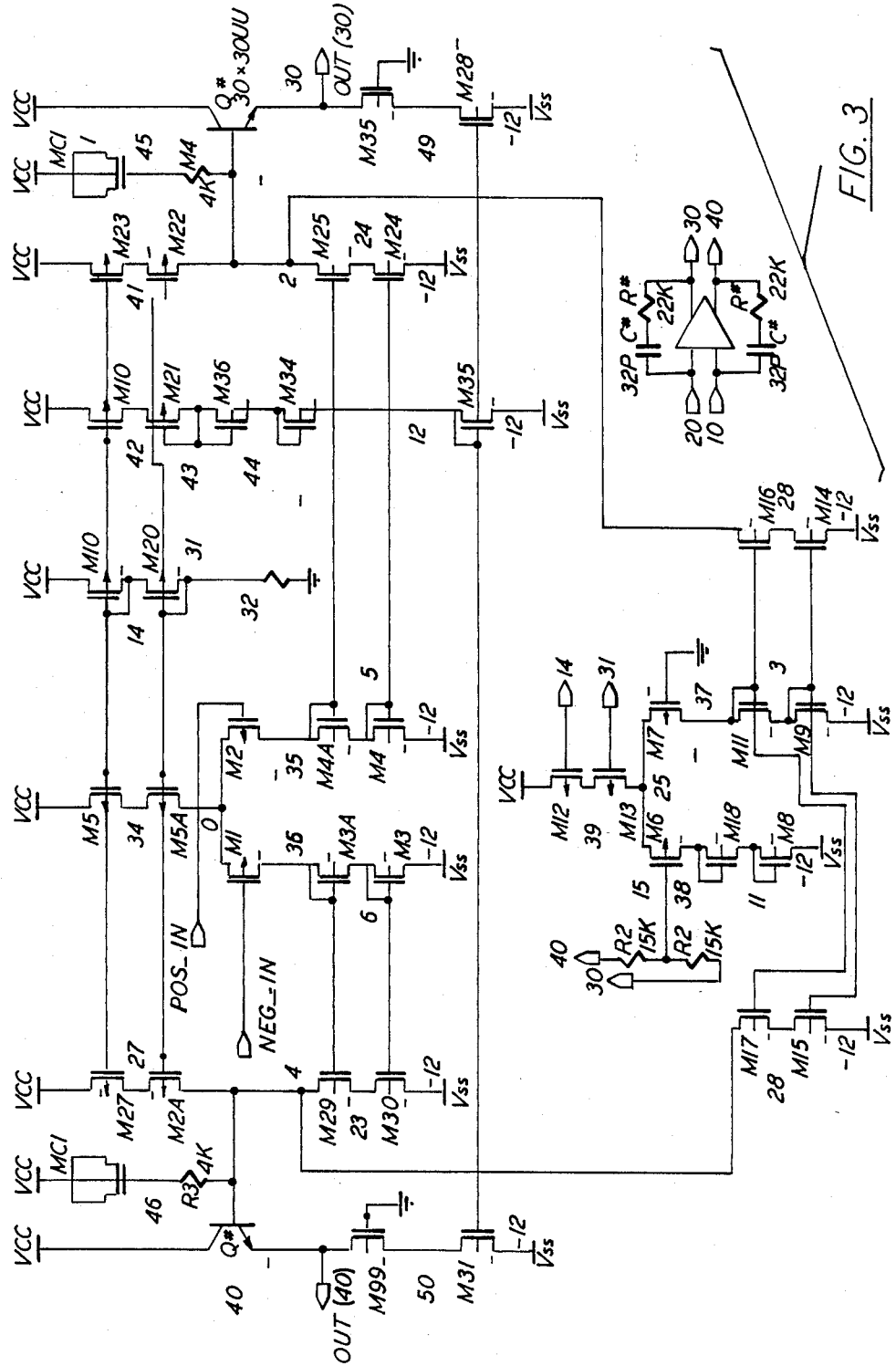
FIG. 3 is a circuit diagram of the integrator for the analog-to-digital converter shown in FIG. 2.

The respective analog and reference currents are combined at nodes 33 and 34 of the novel dual common node feed-back loop 36. The integrator 37, similar in operation to AMD Model No. 7930, is composed of several GM and high gain stages, and a common node stage for maintaining the differential integrator output centered about a zero voltage at all times. The circuit for integrator 37 is shown in FIG. 3.

The combined currents are integrated within the loop 36 by capacitors C1 and C2, and form the inputs to an AMD Model No. 7910 comparator 40.

The comparator 40 digitizes signals by comparing the analog current signals with the reference generated current signals. Another comparator 40 which can be used in circuit 20 for this purpose is described in co-pending U.S. patent application Ser. No. 07/286,206; filed: 12/19/88.

A clocked, binary counter 41 having similar characteristics as a Texas Instruments, Model No. 74AS169 counter, increments and decrements the comparison signals. If the input (analog) currents are higher than the DAC currents, the counter 41 will decrement one step down, and another comparison will take place.

The binary counter 41 is clocked at a clocking rate of 2.048 MHz.

The analog-to-digital circuit 20 of this invention is currently available as a CMOS AMD chip, Model No. Am79C02 or & Am9489, Austin, Tex. division.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented by the subsequently appended claims.

What is claimed is:

1. A time continuous, over-sampled, differential analog-to-digital converter, comprising:
   input means defining a split input stage for supplying analog current signals;
   a continuous, differential, non-switch capacitive integrator having common node feed-back, operatively connected to said split input stage;
   a differential current generator forming a feedback loop circuit with said continuous, differential, non-switch capacitive, common node integrator for providing generated current signals;
   a comparator operatively connected to said differential integrator within said loop circuit for digitizing analog signals, and for comparing generated current signals with analog current signals; and
   a clocked, binary counter operatively connected to said comparator for incrementing or decrementing one step in response to each comparison of a generated current signal with an analog current signal.

2. The time continuous, over-sampled, differential analog-to-digital converter of claim 1, wherein said input means comprises a pair of operational amplifiers fed by a split analog voltage source and a pair of resistors respectively connected to said operational amplifiers for providing differential analog current signals from analog voltages.

3. The time continuous, over-sampled, differential analog-to-digital converter of claim 1, wherein said binary counter is clocked at 2.048 MHz.

4. The time continuous, over-sampled, differential analog-to-digital converter of claim 1, wherein said differential current generator comprises a 6.02 dB per bit DAC.

5. The time continuous, over-sampled, differential analog-to-digital converter of claim 1, wherein said continuous, differential, non-switch capacitive common node integrator is operatively connected within said loop with said differential current generator, wherein said loop comprises a pair of split capacitor and resistor elements.

6. The time continuous, over-sampled, differential analog-to-digital converter of claim 1, wherein said converter forms a CMOS integrated circuit.

7. The time continuous, over-sampled, differential analog-to-digital converter of claim 1, wherein said converter forms part of an audio system.

8. The time continuous, over-sampled, differential analog-to-digital converter of claim 1, wherein said converter forms part of a CODEC.

9. The time continuous, over-sampled, differential analog-to-digital converter of claim 1, wherein said converter forms part of a MODEM.

* * * * *